United States Patent
Baker et al.

(10) Patent No.: US 6,248,656 B1
(45) Date of Patent: Jun. 19, 2001

(54) METAL-JACKETED LEAD MANUFACTURING PROCESS USING RESIST LAYERS

(75) Inventors: David R. Baker, Cupertino; John Grange, San Jose; David Light, Los Gatos; Hung-Ming Wang, San Jose, all of CA (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 09/374,394

(22) Filed: Aug. 13, 1999

Related U.S. Application Data

(60) Provisional application No. 60/096,379, filed on Aug. 13, 1998.

(51) Int. Cl.$^7$ .................................................. H01L 21/44
(52) U.S. Cl. .......................... 438/611; 438/121; 438/622
(58) Field of Search .............................. 438/611, 584, 438/622, 106, 121, 123

(56) References Cited

U.S. PATENT DOCUMENTS

| | | | |
|---|---|---|---|
| 5,145,571 | * | 9/1992 | Lang et al. . |
| 5,148,265 | | 9/1992 | Khandros et al. ............... 357/80 |
| 5,148,266 | | 9/1992 | Khandros et al. ............... 357/80 |
| 5,489,749 | | 2/1996 | DiStefano et al. .............. 174/261 |
| 5,518,964 | | 5/1996 | DiStefano et al. .............. 437/209 |
| 5,536,909 | | 7/1996 | DiStefano et al. .............. 174/261 |
| 5,597,470 | | 1/1997 | Karavakis et al. .............. 205/118 |
| 5,619,017 | | 4/1997 | DiStefano et al. .............. 174/260 |
| 5,814,557 | * | 9/1998 | Venkatraman et al. . |

FOREIGN PATENT DOCUMENTS

WO 94/03036    2/1994   (WO) .

* cited by examiner

*Primary Examiner*—Kevin M. Picardat
*Assistant Examiner*—D. M. Collins
(74) *Attorney, Agent, or Firm*—Lerner, David, Littenberg, Krumholz & Mentlik, LLP

(57) ABSTRACT

Metal leads are formed on a copper conductive layer by applying a first resist and a main resist over the first resist, and forming aligned openings in these resist. A bottom layer of cover metal such as gold is plated onto the copper conductive layer in these openings, followed by a principal metal such as copper. The main resist is then removed so as to expose edges of the principal metal layer. A jacket of cover metal is plated onto the exposed edges and surfaces of the principal metal layer. During this stage, the first resist prevents deposition of the cover metal except on the leads. The jacket merges with the bottom layer of cover material, so as to form a continuous coating extending around the perimeters of the leads. The first resist is removed, and the conductive layer is etched away. The cover metal protects the principal metal during the etching stage.

25 Claims, 5 Drawing Sheets

METAL-JACKETED LEAD MANUFACTURING PROCESS USING RESIST LAYERS

CROSS-REFERENCE TO RELATED APPLICATIONS

The present application claims benefit of U.S. Provisional Patent Application 60/096,379 filed Aug. 13, 1998, the disclosure of which is hereby incorporated by reference herein. The present application is also related to copending, commonly assigned U.S. patent application Ser. No. 09/247,156 Feb. 9, 1999, the disclosure of which is hereby incorporated by reference herein.

BACKGROUND OF THE INVENTION

Many components used in microelectronic assemblies include fine leads which are used for connection to other elements of the device. For example, as taught in commonly assigned U.S. Pat. Nos. 5,148,265; 5,148,266; 5,489,749; 5,536,909; 5,518,964 and 5,619,017 and PCT Publication WO/94/03036 the disclosures of which are hereby incorporated by reference herein, a microelectronic connection component may include a large number of electrically conductive terminals and leads disposed on a suitable support such as a dielectric sheet or a composite element including both metal and dielectric layers. The leads may include connection sections projecting beyond edges of the support or across apertures in the support. The connection sections may be bonded to contacts on a semiconductor chip to thereby connect the chip contacts to the terminals on the component. Most often, the leads are formed principally from a metal such as copper or a copper-based alloy. As disclosed, for example, in commonly assigned U.S. Pat. No. 5,597,470, it is often desirable to provide a layer of a cover metal over some or all of the surfaces of the principal metal portion of the lead. Depending upon the particular application, the cover metal may provide enhanced properties such as easier bonding of the leads to chip contacts or other structures; enhanced fatigue resistance; or enhanced corrosion resistance.

One common procedure for making leads on a support utilizes a thin conductive layer, typically copper, on a dielectric layer such as a dielectric layer of a rigid circuit panel or a flexible circuit panel, commonly referred to as "tape." A layer of photoresist is applied over the conductive layer and patterned using conventional photographic processes to provide a series of openings in the form of elongated slots at locations where the leads are to be formed. The slots in the photoresist leave portions of the conductive layer at the bottom of each slot exposed. The principal metal such as copper is then deposited in the slots, typically by electroplating the principal metal onto portions of the conductive layer exposed within each slot. The principal metal deposited within each slot fills the bottom portion of the slot. A layer of the cover metal is deposited onto the top surface of the principal metal deposit, facing away from the support, by a further electroplating step. The photoresist is removed and the part is exposed to an etchant which will attack the conductive layer, thereby removing the conductive layer from regions between the leads. In a variant of this process, a layer of the cover metal is deposited on the conductive layer within each slot before deposition of the principal metal, so as to form a cover metal layer on the bottom surface of each principal metal deposit, facing toward the support. After the etching step used to remove the conductive layer, further cover metal may be deposited onto all of the lead surfaces, as by a further electroplating, electroless plating or immersion plating step.

Typically, the etchant which is used to remove the conductive layer will not attack the cover layer appreciably but will attack the principal metal. The cover layer on the top surface of the principal metal will protect the principal metal from the etchant to some degree. A cover layer on the bottom surface can also provide some protection. However, the vertically extending edge surfaces of the principal metal are not covered by the cover metal, and these surfaces are attacked by the etchant. Loss of principal metal results in a lead having an irregular cross-sectional shape and "undercutting" or removal of principal metal from beneath the top cover layer, leaving portions of the top cover layer projecting laterally at edges of the lead. Moreover, the principal metal in the finished lead will have cross-sectional area smaller than the cross-sectional area of the original principal metal deposit. All of these phenomena tend to weaken the lead, and to reduce its electrical performance. These phenomena are subject to some variability depending on variations in the etching process. These phenomena and variations in these phenomena are more significant in the case of fine leads, with small nominal cross-sectional dimensions. Thus, there has been a need for a lead-forming process which will alleviate the problem of edge surface undercutting.

Other metallic elements are also formed by processes similar to the lead-forming process discussed above. For example, metallic terminals are often formed on supports using a process which is the same as the conventional lead-forming process discussed above, except that the openings in the photo resist layer may be in the form of circular discs, squares, ovals or other desired terminal shapes rather than elongated slots. The openings used to form the terminals may be connected with the elongated slot like openings used to form the leads, so as to form the terminals integral with the leads. Etching of the terminal edge surfaces presents the same problem as discussed above with reference to the leads. Similar problems can occur in formation of still other conductive elements, and hence there has been a similar need for a fabrication procedure which alleviates these problems.

SUMMARY OF THE INVENTION

One aspect of the present invention provides processes for forming metallic features on a base. A method according to this aspect of the invention preferably includes the step of providing a base with an electrically conductive layer on a first surface of the base, and depositing a first resist over the conductive layer. The method also desirably includes applying and patterning a main resist atop the first resist so as to leave openings in said main resist in locations where metallic features are to be formed, and forming openings in said first resist in registration with the openings in the main resist so that the conductive layer is exposed in said openings of said main resist. Once these openings have been provided, principal metal such as a copper alloy is deposited in the openings. After the principal metal has been deposited, the main resist is removed while the first resist is left in place, thereby exposing edges of the principal metal. A jacket of a cover metal is then deposited onto the edges of the principal metal. This jacket protects the edges of the principal metal during subsequent etching steps used to remove the conductive layer. Most preferably, the method includes the step of depositing a bottom cover metal layer in said openings before depositing said principal metal, and the said cover metal jacket deposited onto said principal metal merges with said bottom cover metal layer. The cover metal jacket and the bottom cover layer cooperatively surround the principal metal. For example, where the metallic features formed in the process include elongated leads, the cover metal desirably surrounds each lead around its entire perimeter at at least some points along the length of the lead.

The process in its preferred forms makes it possible to form leads with accurately-controlled dimensions, without substantial erosion of the leads during the etching process used to remove the conductive layer. Moreover, because the cover metals, such as gold, tend to have good bonding properties and good fatigue resistance, the process can provide leads having these properties where they are most needed—on the exterior or surface regions of the leads.

As further discussed below, the first resist may be a conventional photoresist or other dielectric material, or else may be a metal, such as chromium, which resists deposition of the cover metal during the process used to apply the cover metal. Thus, unless otherwise specified herein, term "resist" as used in this disclosure should not be limited to the dielectric materials commonly utilized as resists in the art, but should be understood as encompassing any material which will prevent deposition of the cover metal. Also, the step of depositing the resists may be performed in various ways, including both electorphoretic deposition and coating processes commonly used to apply conventional dielectric resists, as well as laminating a solid film of a resist to the underlying layers and, in the case of certain resists such as metals, processes such as plating, chemical vapor deposition and sputtering commonly used to deposit these materials.

These and other objects, features and advantages of the present invention will be more readily understood in light of the detailed description of the preferred embodiments set forth below, taken in conjunction with the accompanying drawings.

DETAILED DESCRIPTION OF THE PREFERRED EMBODIMENTS

Figure 1A:
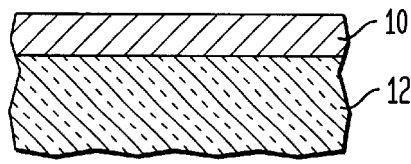
FIGS. 1A through 1K are fragmentary, diagrammatic sectional views depicting portions of a component during successive stages of a process according to one embodiment of the invention.
Figure 1B:
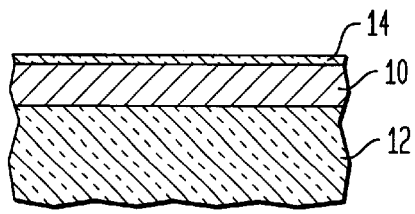
Figure 1C:
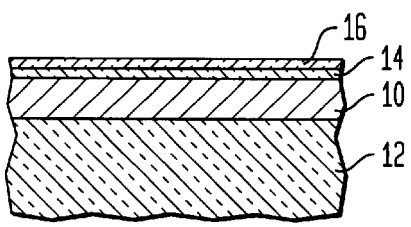

A process according to one embodiment of the invention begins with a conductive layer 10 (FIG. 1A) formed on a first or upper surface of a dielectric base structure 12. Typically, the conductive layer is formed from a metal such as copper or a copper-based alloy, whereas the dielectric base structure is formed from a polymeric dielectric such as polyimide. Although the dielectric base structure is shown as a simple layer of dielectric, in practice dielectric layer may incorporate additional structures such as internal reinforcements and conductive elements such as potential planes and layers of conductive traces.

A thin, first resist, also referred to as a sub-resist 14, typically about 0.5–2 μm thick, is provided over the conductive layer. A protective layer 16, which is desirably about 0.1 μm thick is then provided atop the first resist, as by sputtering. In the particular process depicted, the protective layer is electrically conductive. For example, the protective layer may include a metal such as copper, nickel, a nickel-copper alloy such as Monel or chromium, or may include a conductive carbon layer.

Figure 1D:
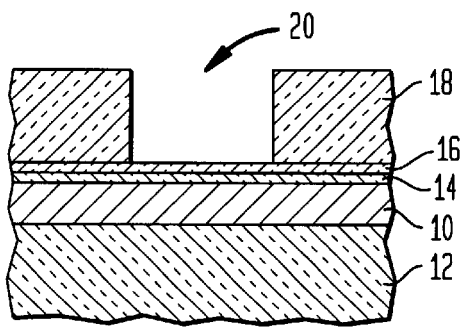
Figure 1E:
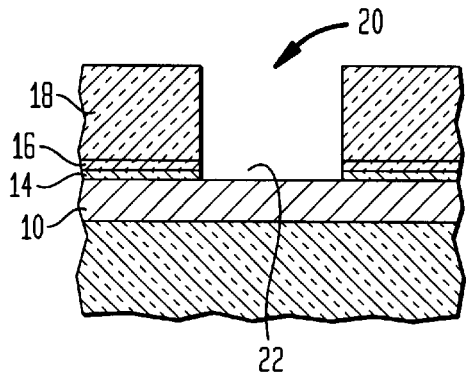

A relatively thick main resist 18 (FIG. 1D) is then applied and patterned using a conventional photographic or other process. In the particular embodiment illustrated, the main resist is an electrophoretically deposited ("ED") acrylic resist about 15–40 μm thick. Desirably, the thickness of the main resist is comparable to the thickness of the leads which are to be formed. The conductivity of the protective layer is useful in applying the electrophoretically deposited resist. The patterned main resist includes openings 20 such as slots where elongated leads or other features are desired. As shown in FIG. 1E, openings 22 are formed in the protective layer 16 and in the first resist 14, in registration with the openings 20 in the resist, thereby exposing the original conductive layer 10. The openings in the first resist and protective layers can be formed by exposure to a plasma which attacks both the first resist and the protective layer, such as an oxidizing plasma. For example, where the protective layer is formed from carbon and the first resist is a polymeric material, a plasma containing a halogen such as fluorine, with or without oxygen, may be used to attack the protective layer and the first resist. Alternatively, the component may be exposed to an etching solution which attacks the protective layer 16 but which does not substantially attack the main resist 18 as, for example, an $HCl/CuCl_2$ etchant or preferably $H_2O_2/SO_4$ to form an opening in the protective layer 16. Following formation of the opening in the protective layer, the component is exposed to a stripper or plasma which attacks the first resist 14. The stripper or plasma which attacks the first resist and/or protective layer may also attack the main resist 18. However, the main resist is thick enough so that such attack does not completely remove the main resist. The main resist acts as a mask in etching of the protective layer and first resist, so that the openings in the protective layer and first resist are automatically aligned with the openings of the main resist. In an alternative process, the openings in the first resist and protective layer may be formed before deposition of the main resist, in which case the step of forming the openings 20 in the main resist 18 is conducted so that the openings in the main resist are in registration with the previously-formed openings 22 in the first resist and 14 protective layer 16.

Figure 1F:
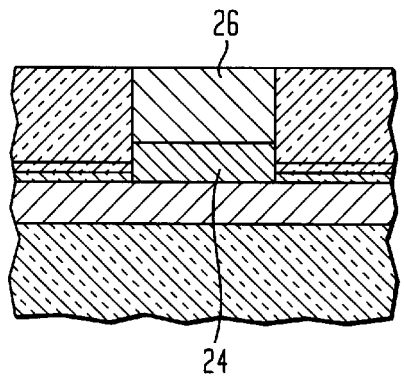
Figure 1G:
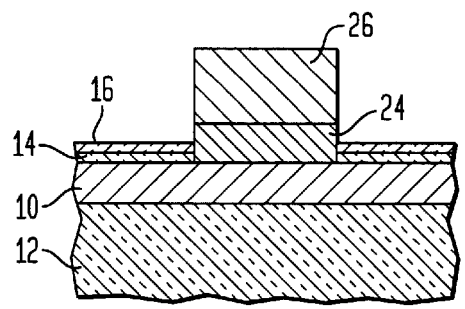
Figure 1H:
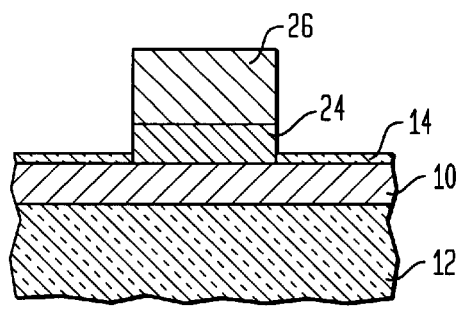

A bottom layer 24 of a relatively etch-resistant cover metal such as gold, platinum, rhodium, palladium or alloys thereof (FIG. 1F) is then deposited by electroplating or electroless plating on the portions of the conductive layer 10 exposed in the openings 22. Following deposition of the bottom cover metal layer, a layer 26 of a principal metal such copper or copper alloy is deposited over the bottom cover metal layer. In a variant of the process, a further layer (not shown) of the cover metal can be deposited on the top surface of the principal metal layer at this stage. The main resist 18 is then removed by a conventional stripper, leaving the component in the configuration shown in FIG. 1G. During removal of the main resist, the protective layer 16 of conductive material protects the first resist. The protective layer is then removed by an additional process such as a flow etching process, i.e., etching with a flowing etchant such as $HCl/CuCl_2$ solution. A reverse electroplating process, wherein the conductive layer is maintained at a positive potential with respect to a counterelectrode may also be employed. Because the protective layer is extremely thin (typically less than 0.5 microns and desirably about 0.1 micron thick), an extremely brief etching process may be used to remove it. This brief process does not remove appreciable portions of the principal metal. Removal of the protective layer leaves the first resist or sub-resist 14 exposed as seen in FIG. 1H.

Figure 1I:
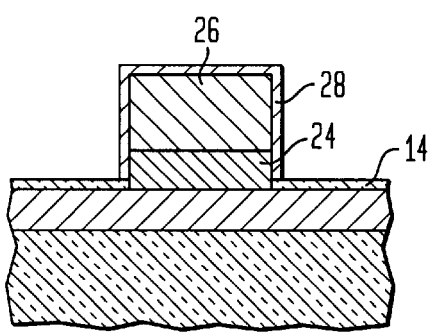
Figure 1J:
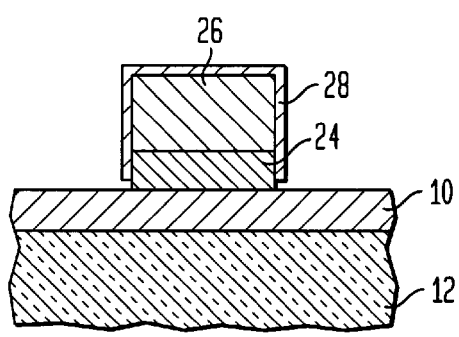

A further cover metal layer 28 is then applied on the top and sides of the principal metal deposit 26 by electroplating. The first resist prevents deposition of the cover metal on conductive layer 10. As shown in FIG. 1I, the bottom cover metal deposit 24 is thicker than the first resist or sub-resist 16. Therefore, the cover metal 28 plated onto the sides of the principal metal deposit joins with the cover metal of this bottom deposit 24, so that the principal metal is entirely surrounded by a continuous layer of the cover metal. The first resist is then removed, leaving the original conductive layer exposed, as seen in FIG. 1J.

Figure 1K:
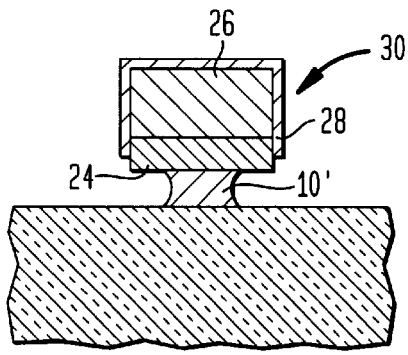

Portions of conductive layer 10 are then removed by etching, leaving the completed leads 30, as seen in FIG. 1K. The cover metal protects the principal metal 26 in the leads during this etching procedure. Depending upon the particular procedures used to etch away the conductive layer, a residual part 10' of the conductive layer may remain beneath each lead as seen in FIG. 1K. The residual portion of the conductive metal forms an attachment 10' between the completed lead 30 having horizontal dimensions (in directions parallel to the surface of the base layer 12) smaller than the comparable horizontal dimensions of the lead itself. As described in certain preferred embodiments of the aforementioned U.S. Pat. No. 5,518,964, and as further described in certain preferred embodiments of copending, commonly assigned U.S. patent applications Ser. Nos. 09/020,750 and 09/195,371, the disclosures of which are hereby incorporated by reference herein, such an attachment can provide a detachable connection between the connected region of the lead and the base layer. The attachment 10' can be peeled away or broken as the lead is pulled away from the base layer. The attachment 10' also can serve as a permanent bond between the lead and the base layer. To provide such a permanent bond, the etching process used to remove the base layer desirably is terminated while the attachment 10' still occupies a substantial portion of the space beneath the completed lead. The leads may also be formed in conjunction with, or attached to, other metallic features such as plated vias (not shown) which extend into or through the base layer and which further anchor the completed leads to the base layer. Moreover, the leads may be formed in conjunction with features such as terminals or bus bars having horizontal dimensions larger than the widthwise dimensions of the leads. A substantial portion of the conductive layer 10 remains as an attachment beneath each such larger feature, leaving the larger feature permanently connected to the base layer.

Figure 1L:
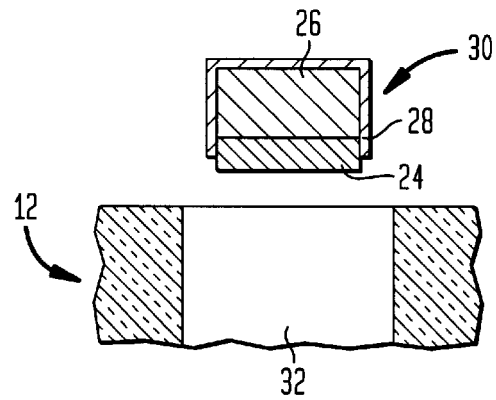
FIG. 1L is a view similar to FIG. 1K but depicting a component in a variant of the process shown in FIGS. 1A–1K.

As seen in FIG. 1L, the base 12 can be treated using conventional processes such as laser ablation and/or chemical etching to form openings 32 aligned with the leads or other features formed by the process. However, if the opening is formed before the etching procedure is commenced, the residual part of the conductive layer will not be left. Instead, all surfaces of the lead will have the cover metal 28 and 24 exposed. Here again, although the cross-sectional view of FIG. 1L shows the lead 30 detached from the base layer, it should be appreciated that the lead typically is connected to other metallic features (not shown) which remain anchored to the base layer 12. For example, leads extending across openings in base 12 may incorporate frangible sections or other detachable securements as described in certain embodiments of U.S. Pat. Nos. 5,915,752 and 5,536,909, the disclosures of which are hereby incorporated by reference herein. As described in greater detail in certain embodiments of these patents, the base with the leads thereon can be positioned on a microelectronic element such as a semiconductor chip so as to position the openings and leads in alignment with the contacts on the chip. The leads may be engaged by a bonding tool and moved downwardly into the opening in the base, thereby breaking the frangible section, and may be bonded to the contacts on the chip. In a further variant, the etching process is continued until the conductive layer 10 is entirely removed, even without formation of openings.

Figure 2A:
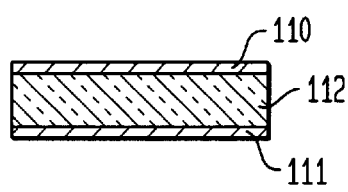
FIGS. 2A through 2O are fragmentary, diagrammatic sectional views depicting portions of a component during successive stages of a process according to another embodiment of the invention.
Figure 2B:
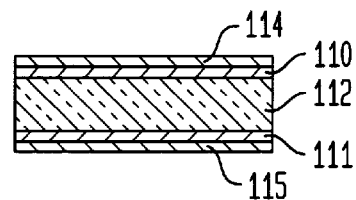
Figure 2C:
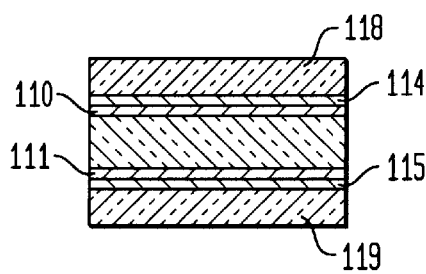

Numerous variations and combinations of the features discussed above can be utilized. For example, where the main resist 18 of FIGS. 1D–1F is not electrophoretically deposited, the protective layer 16 need not be conductive. Indeed, it is not essential to provide the protective layer 16. Thus, a first resist or sub-resist 14 having a chemical composition or properties different from the main resist may be employed, so that the main resist can be removed by a stripper which attacks the main resist but which does not substantially attack the first resist or sub-resist. The remaining steps of the process are the same, except that the step of depositing the protective layer 16 is not employed, so that the main resist is deposited directly on the first resist. Also, the step of stripping the protective layer are not required. Where a conventional photoresist is used as the main resist in such a process, a polymer such as an acrylic, epoxy or polyimide can be used as the first resist. Alternatively, a metal can be used as discussed below with reference to FIGS. 2A–2O.

A process in accordance with a further embodiment of the invention begins with a base such as a polymeric sheet 112 having a first or upper conductive layer 110 on a first surface of the sheet and a second or lower conductive layer 111 on the second surface of the sheet. Merely by way of example, base 112 may be a polyimide sheet 50 $\mu$m thick, whereas each conductive layer 110, 111 may be 5 $\mu$m thick copper. First resist layers 114, 115 are applied over the upper and lower conductive layers. In this embodiment, the first resist layers are formed from a metal such as chromium, molybdenum, tantalum, titanium or zirconium which will not accept electroless or immersion deposition of the cover metal, such as gold, to be used in the process. Chromium is a preferred first resist. The first resist layer desirably is less than about 1 $\mu$m thick. Such a layer can be applied by processes such as electroplating or sputtering. Sputtering is preferred where chromium is used, as it avoids the need for electroplating solutions containing toxic $Cr^{6+}$ ions. Main resist layers 118, 119 (FIG. 2C) are applied over the first resist layers 114 and 115. The main resist may be a conventional photographically patternable polymeric resist.

Figure 2D:
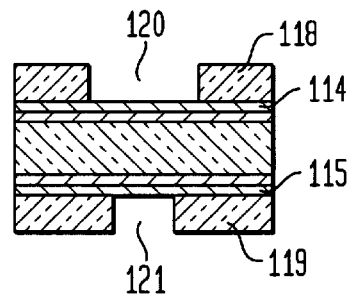
Figure 2E:
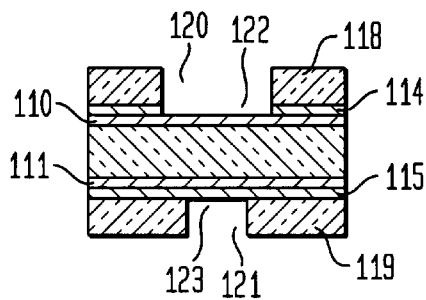

In the next stage of the process, openings 120 are formed in the upper main resist layer 118 where leads are to be provided, and openings 121 are formed in the lower main resist layer 119 at locations where vias or openings are to be formed in base 112, as shown in FIG. 2D. The component is then exposed to a stripping or etching process which attacks the exposed first resist layers 114 and 115 in openings 120 and 121, thereby forming corresponding openings 122 and 123 in the first resist layers (FIG. 2E). Desirably, the stripping process used to form openings 122 and 123 does not also remove the underlying conductive layers 110 and 111. For example, an etchant including alkaline potassium permanganate will remove chromium but will not substantially attack copper. Alternatively, an etching process which attacks the materials of both the first resist layers and the conductive layer may be used, but the etching process may be terminated before the conductive layer are entirely removed.

Figure 2F:
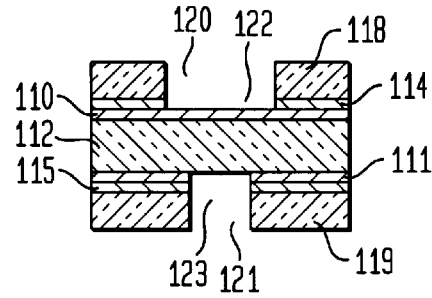

As shown in FIG. 2F, the lower conductive layer 111 is etched away in alignment with the openings 121 and 123 in the lower resist layers 118 and 115, leaving a small region of the polymer surface of base 112 exposed in openings 121 and 123. The upper conductive layer 110 is not etched in this stage. A reverse electroplating potential may be applied only to the lower conductive layer. Alternatively, a temporary masking material (not shown) may be applied over the upper surface of the component during this procedure and then removed.

Figure 2G:
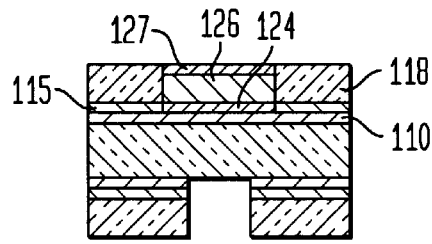
Figure 2H:
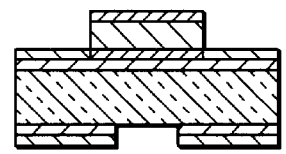
Figure 2I:
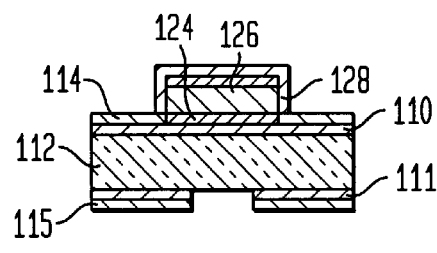
Figure 2J:
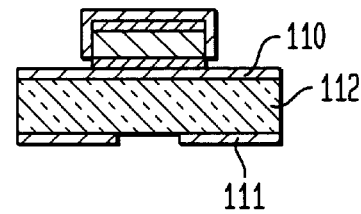
Figure 2K:
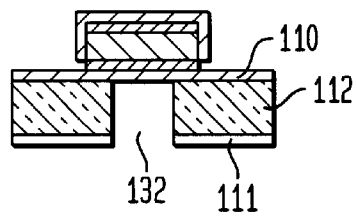

In the next stage of the process, a bottom layer 124 (FIG. 2G) of a cover metal such as gold is plated onto the upper conductive layer 110 in the openings formed in the upper first resist and main resist layers, followed by a principal metal layer 126 and a top layer 127 of cover metal. Merely by way of example, the bottom layer of cover metal 124 may consist of 0.5–1.0 $\mu$m thick gold, whereas the principal metal layer 126 may be 15 $\mu$m thick copper or copper alloy, and the top layer of cover metal 127 may be 2 $\mu$m thick gold. Following deposition of the lead-forming layers 124, 126 and 127, the upper and lower main resists 118 and 119 are removed (FIG. 2H), whereupon the component is subjected to immersion plating or electroless plating of a further cover metal layer 128 (FIG. 2I), desirably about 0.3 $\mu$m or less thick gold. Because the gold used to form the cover layer 128 will not plate onto the first resist layers 114 and 115, or on the exposed polymer surface of layer 112 the gold is deposited only on the surfaces of the lead. If the plating solution tends to deposit gold on the exposed polymer surface, the lower side of the part can be protected by a temporary resist layer (not shown) during application of the gold. Here again, the cover layer 128 extending on the top and sides of the lead merges with the bottom cover layer 124 so that the cover metal fully surrounds the principal metal 126 of the lead. In a variant of this procedure, the top cover metal layer 127 may be omitted, so that only layer 128 covers the top of the principal layer 126. In the next stage of the process, the upper first resist 114 and lower first resist 115 are removed, leaving the upper and lower conductive layers 110 and 111 exposed (FIG. 2J).

Figure 2L:
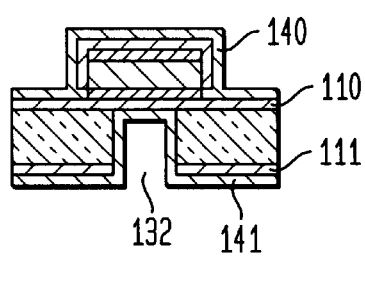
Figure 2M:
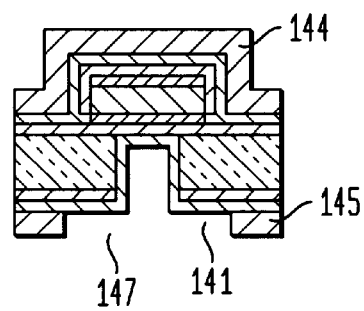
Figure 2N:
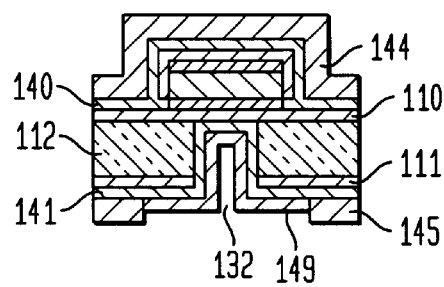
Figure 2O:
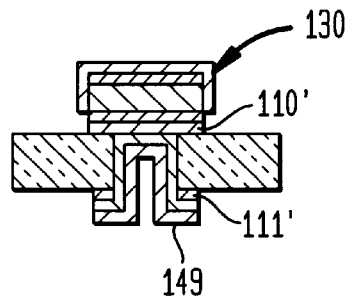

Following removal of the first resists, the base 112 is laser-ablated to form openings 132 extending through the base from the bottom of the base to the upper conductive layer 110. The metal of the lower conductive layer 111 acts as a mask during this procedure. In the next phase of the process (FIG. 2L), the entire upper surface of the part is covered with a thin layer 140 of copper or other conductive, readily-etchable material, whereas the lower surface is covered with a similar layer 141. Layer 141 also extends into the holes or vias 132, and merges with the upper conductive layer 110. These layers may be applied by electroless deposition of copper, with or without a further electroplating step. After application of layers 140 and 141, the upper surface is cover with a continuous resist layer 144, whereas the lower surface is covered with a patterned resist layer 145 having apertures 147 where conductive features such as terminals are to be formed on the lower surface of the part. As seen in FIG. 2M, apertures 147 desirably encompass openings or vias 132. A metal such as gold is then deposited over layer 141 in the apertures 147 and in vias 132, so as to form conductive features 149 on the lower surface of the part. These conductive features include via liners extending within vias 132 and joining with the leads on the upper surface of the part.

In the final stage of the process, resist layers 144 and 145 are stripped. The part is etched to remove copper layers 140, 141, 110 and 111. However, the etching process is terminated before those portions of conductive layers 110 and 111 underlying the leads 130 and conductive features 149 are removed. This leaves the conductive features 149 on the lower surface connected to the leads.

The process discussed above with reference to FIGS. 2A–2O can be varied. For example, if the continuous resist 144 is applied before the electroless plating step used to deposit layer 141 on the lower surface, no electroless copper layer 140 will be applied on the top surface. Also, those portions of leads 130 remote from the vias 132 may have smaller widthwise dimensions than the portions disposed above the vias. The upper conductive layer 110 can be substantially or entirely removed from beneath these portions of the leads. Also, additional openings remote from the vias can be formed in base 112, and the conductive layer 110 can be etched through these openings, in the same manner as discussed above with reference to FIG. 1L. The lead-forming steps discussed above with reference to FIGS. 2A–2O can be practiced without the bottom conductive layer and without the steps used to form the vias and the conductive features on the bottom surface.

In the embodiments discussed above, all of the cover metal applied at various stages in the process has the same composition. However, this is not essential. For example, the cover metal applied as the bottom layer may include gold, whereas the cover metal applied over the top surfaces and edge surfaces of the principal metal may include palladium or another etch-resistant metal. As these and other variations and combinations of the features discussed above may be employed, the foregoing description of the preferred embodiments should be taken by way of illustration rather than as limiting the invention defined by the claims.

What is claimed is:

1. A process for forming metallic features on a base comprising the steps of:
    (a) providing a base with a first electrically conductive layer on a first surface of the base;
    (b) depositing a first resist over the conductive layer;
    (c) applying and patterning a main resist atop said first resist so as to leave openings in said main resist at locations where metallic features are to be formed;
    (d) forming openings in said first resist in registration with the openings in the main resist so that the conductive layer is exposed in said openings of said main resist; then
    (e) depositing a principal metal in said openings; then
    (f) removing said main resist while leaving said first resist, thereby exposing edges of the principal metal; and then
    (g) depositing a jacket of a cover metal onto the edges of the principal metal.

2. A process as claimed in claim 1 further comprising the step depositing a bottom layer cover metal in said openings before depositing said principal metal.

3. A process as claimed in claim 2 wherein said cover metal jacket deposited onto said principal metal merges with said bottom layer of cover metal.

4. A process as claimed in claim 3 further comprising the step of depositing a top layer of cover metal in said openings after depositing said principal metal layer but before removing said main resist, whereby said top layer cover metal will merge with said jacket of cover metal.

5. A process as claimed in claim 3 or claim 4 wherein said metallic features include elongated metallic leads and wherein the cover metal deposited in the aforesaid steps entirely surrounds said principal metal at at least some locations along the length of the lead.

6. A process as claimed in claim 2 further comprising the step of applying a protective layer over said first resist before applying said main resist, and forming openings in said protective layer in registration with the openings in said main resist before application of said bottom cover metal layer and said principal metal.

7. A process as claimed in claim 6 wherein said first resist is a dielectric meterial.

8. A process as claimed in claim 6 wherein said protective layer is electrically conductive and said main resist is applied onto said protective layer by electrophoretic deposition.

9. A process as claimed in claim 6 further comprising the step of removing said protective layer before said step of depositing cover metal on said principal metal.

10. A process as claimed in claim 2 or claim 6 wherein said bottom cover metal layer is thicker than said first resist.

11. A process as claimed in claim 1 or claim 2 or claim 3 or claim 6 further comprising the step of removing said first resist.

12. A process as claimed in claim 11 further comprising the step of at least partially removing said conductive layer, the cover metal applied in the aforesaid steps protecting said principal metal during said step of removing said conductive layer.

13. A process as claimed in claim 12 wherein said step of at least partially removing said conductive layer includes exposing the conductive layer to an etchant which attacks the conductive layer but does not substantially attack the cover metal.

14. A process as claimed in claim 12 wherein said step of at least partially removing said conductive layer is terminated so as to leave portions of the conductive layer as attachments disposed between the conductive features and the base.

15. A process as claimed in claim 1 wherein said first resist includes a metal selected from the group consisting of chromium, molybdendum, tantalum, titanium or zirconium.

16. A process as claimed in claim 15 wherein said first resist consists essentially of chromium.

17. A process as claimed in claim 1 or claim 2 wherein said first conductive layer is provided on a first surface of the base, the method further comprising forming openings in said base extending from a second surface of said base through the base to the first conductive layer.

18. A process as claimed in claim 17 further comprising etching away said first conductive layer after forming said openings, the cover metal applied in the aforesaid steps protecting said principal metal during said step of etching away said first conductive layer.

19. A process as claimed in claim 17 further comprising the step of forming metallic via liners in said openings extending from said second surface of said base through the base to the first conductive layer, whereby said conductive features on said first surface of said base are connected to said via liners through said first conductive layer.

20. A process as claimed in claim 19 further comprising etching away those portions of said first conductive layer not covered by the conductive features formed from said principal metal and the cover metal, at least some portions of the first conductive layer disposed between said conductive features and said via liners remaining after said etching step.

21. A process as claimed in claim 20 further comprising forming additional conductive features on said second surface of said base connected to said via liners.

22. A process as claimed in claim 1 or claim 2 or claim 6 or claim 15 wherein said principal metal is selected from the group consisting of copper and copper alloys, and wherein said cover metal is selected from the group consisting of gold and gold alloys.

23. A process as claimed in claim 1 wherein said first resist is a dielectric material.

24. A process as claimed in claim 23 wherein said main resist is deposited directly on said dielectric first resist.

25. A process as claimed in claim 24 wherein said main resist is a photoresist.

* * * * *

UNITED STATES PATENT AND TRADEMARK OFFICE
CERTIFICATE OF CORRECTION

PATENT NO. : 6,248,656 B1  
DATED : June 19, 2001  
INVENTOR(S) : Baker et al.

It is certified that error appears in the above-identified patent and that said Letters Patent is hereby corrected as shown below:

<u>Title page,</u>
Item [75], after "Hung-Ming" insert -- (Tony) --.

Signed and Sealed this

Sixteenth Day of April, 2002

Attest:

Attesting Officer

JAMES E. ROGAN  
Director of the United States Patent and Trademark Office